United States Patent
Kiguchi et al.

(10) Patent No.: US 12,212,224 B2
(45) Date of Patent: Jan. 28, 2025

(54) DRIVING APPARATUS

(71) Applicant: FUJI ELECTRIC CO., LTD., Kanagawa (JP)

(72) Inventors: Ryoga Kiguchi, Tachikawa (JP); Hiromu Takubo, Hachioji (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 411 days.

(21) Appl. No.: 17/452,071

(22) Filed: Oct. 25, 2021

(65) Prior Publication Data

US 2022/0209645 A1 Jun. 30, 2022

(30) Foreign Application Priority Data

Dec. 25, 2020 (JP) ................. 2020-216718

(51) Int. Cl.
*H02M 1/08* (2006.01)
*H03K 17/0412* (2006.01)
*H03K 17/56* (2006.01)

(52) U.S. Cl.
CPC ........ *H02M 1/08* (2013.01); *H03K 17/04126* (2013.01); *H03K 17/56* (2013.01)

(58) Field of Classification Search
CPC ............. H03K 17/56; H03K 17/163; H03K 17/04126; H02M 1/0054; H02M 1/08; H02M 1/0029; H02M 1/0038; H02M 7/5387; H02M 1/38
USPC .................................................. 318/400.32
See application file for complete search history.

(56) References Cited

U.S. PATENT DOCUMENTS

| | | | | |
|---|---|---|---|---|
| 6,678,180 B2 * | 1/2004 | Matsuda | ........... | H02M 1/38 |
| | | | | 363/56.02 |
| 7,369,378 B2 * | 5/2008 | Sunaga | ........... | H02P 7/29 |
| | | | | 361/91.1 |
| 8,031,496 B2 * | 10/2011 | Saji | ........... | H02M 3/33507 |
| | | | | 363/21.16 |
| 9,450,517 B2 * | 9/2016 | Kusama | ........... | H02M 7/537 |
| 2013/0278322 A1 * | 10/2013 | Choung | ........... | H03K 17/04123 |
| | | | | 327/382 |
| 2016/0344301 A1 * | 11/2016 | Maruyama | ........... | H01L 25/18 |
| 2017/0244275 A1 * | 8/2017 | Kobayashi | ........... | H02M 7/06 |

FOREIGN PATENT DOCUMENTS

| | | | | |
|---|---|---|---|---|
| JP | 2000324801 A | | 11/2000 | |
| JP | 2006340579 A | * | 12/2006 | ........... H03K 17/163 |

OTHER PUBLICATIONS

Avago Technologies, Application Note 5314 : Active Miller Clamp, Products with Feature: ACPL-331J, ACPL-332J, Jul. 21, 2010.

* cited by examiner

*Primary Examiner* — Gabriel Agared

(57) ABSTRACT

Provided is a driving apparatus that drives a switching device, the driving apparatus including a reference potential line, a first switching control unit configured to switch whether to connect a control terminal of the switching device to the reference potential line, a first resistor element arranged in series to the first switching control unit in a path from the control terminal of the switching device to the reference potential line, a first capacitor provided in parallel with the first resistor element in the path from the control terminal of the switching device to the reference potential line, and a discharge control unit configured to control whether to discharge the first capacitor.

18 Claims, 13 Drawing Sheets

DRIVING APPARATUS

The contents of the following Japanese patent application is incorporated herein by reference:
2020-216718 filed in JP on Dec. 25, 2020

BACKGROUND

1. Technical Field

The present invention relates to a driving apparatus that drives a switching device.

2. Related Art

Up to now, a driving apparatus that controls a switching device such as a transistor has been proposed (for example, see Patent document 1.
Patent document 1: Japanese Patent Application Publication No. 2000-324801
The driving apparatus can preferably cope with a high speed operation of the switching device.

SUMMARY

To address the above-described issue, according to one aspect of the present invention, there is provided a driving apparatus that drives a switching device. The driving apparatus may include a reference potential line. The driving apparatus may include a first switching control unit configured to switch whether to connect a control terminal of the switching device to the reference potential line. The driving apparatus may include a first resistor element arranged in series to the first switching control unit in a path from the control terminal of the switching device to the reference potential line. The driving apparatus may include a first capacitor provided in parallel with the first resistor element in the path from the control terminal of the switching device to the reference potential line. The driving apparatus may include a discharge control unit configured to control whether to discharge the first capacitor.

The discharge control unit may discharge the first capacitor under a condition that a control voltage at the control terminal of the switching device is lower than or equal to a first threshold voltage. The first threshold voltage may be lower than a plateau voltage of the switching device.

The switching device may be any element of a pair of switching devices configured to operate in a complementary manner. The discharge control unit may discharge the first capacitor from completion of turn-off to start of next turn-on.

The first resistor element may be arranged between the control terminal of the switching device and the first switching control unit. The first capacitor may be arranged in parallel with the first resistor element between the control terminal of the switching device and the first switching control unit.

The driving apparatus may include a first diode arranged in parallel with the first resistor element between the control terminal of the switching device and the first capacitor.

The discharge control unit may include a first transistor arranged between a connection point of the first diode and the first capacitor and the reference potential line.

The driving apparatus may include a second resistor element arranged in series to the first diode between a connection point of the first capacitor and the first transistor and the control terminal of the switching device.

The driving apparatus may include a third resistor element arranged in series to the first transistor between the connection point of the first capacitor and the first transistor and the reference potential line.

The driving apparatus may include a fourth resistor element arranged in series to the first capacitor between a connection point of the first switching control unit and the first resistor element and a connection point of the first diode and the first transistor.

The first diode may be a Zener diode.

A capacitance of the first capacitor may be variable. The driving apparatus may include a capacitance control unit configured to control the capacitance of the first capacitor.

A resistance value of the second resistor element may be variable. A resistance value of the third resistor element may be variable. A resistance value of the fourth resistor element may be variable. The driving apparatus may include a resistance control unit configured to control a resistance value of a resistor element.

The switching device may be a wide bandgap semiconductor device using at least one of silicon carbide, gallium nitride, gallium oxide, and diamond as a main material. The first capacitor may have a capacitance in which electric charge of the control terminal can be moved and accumulated until a control voltage at the control terminal of the switching device turns to a plateau voltage.

DESCRIPTION OF EXEMPLARY EMBODIMENTS

Hereinafter, the present invention will be described by way of embodiments of the invention, but the following embodiments are not intended to restrict the invention according to the claims. In addition, not all combinations of features described in the embodiments necessarily have to be essential to solving means of the invention. Note that in the present specification and drawings, an element having a substantially identical function or configuration is assigned with the identical reference sign, so that duplicated description will be omitted, and an illustration of an element that is not directly related to the present invention will be omitted. In addition, in one drawing, a representative element among elements having the identical function or configuration is assigned with a reference sign, and reference signs for the others may be omitted.

In the present specification, when such a term "identical" or "equal" is used, a case where an error derived from a production tolerance or the like is present may also be included. The error is, for example, within 10%. In addition, when the term like "identical" or "equal" is used, approximate values may be set due to costs. With regard to the approximate values, for example, an E-series value is adopted from among non-series values as in "3.1Ω is set as 3.3Ω" or the like.

Figure 1:
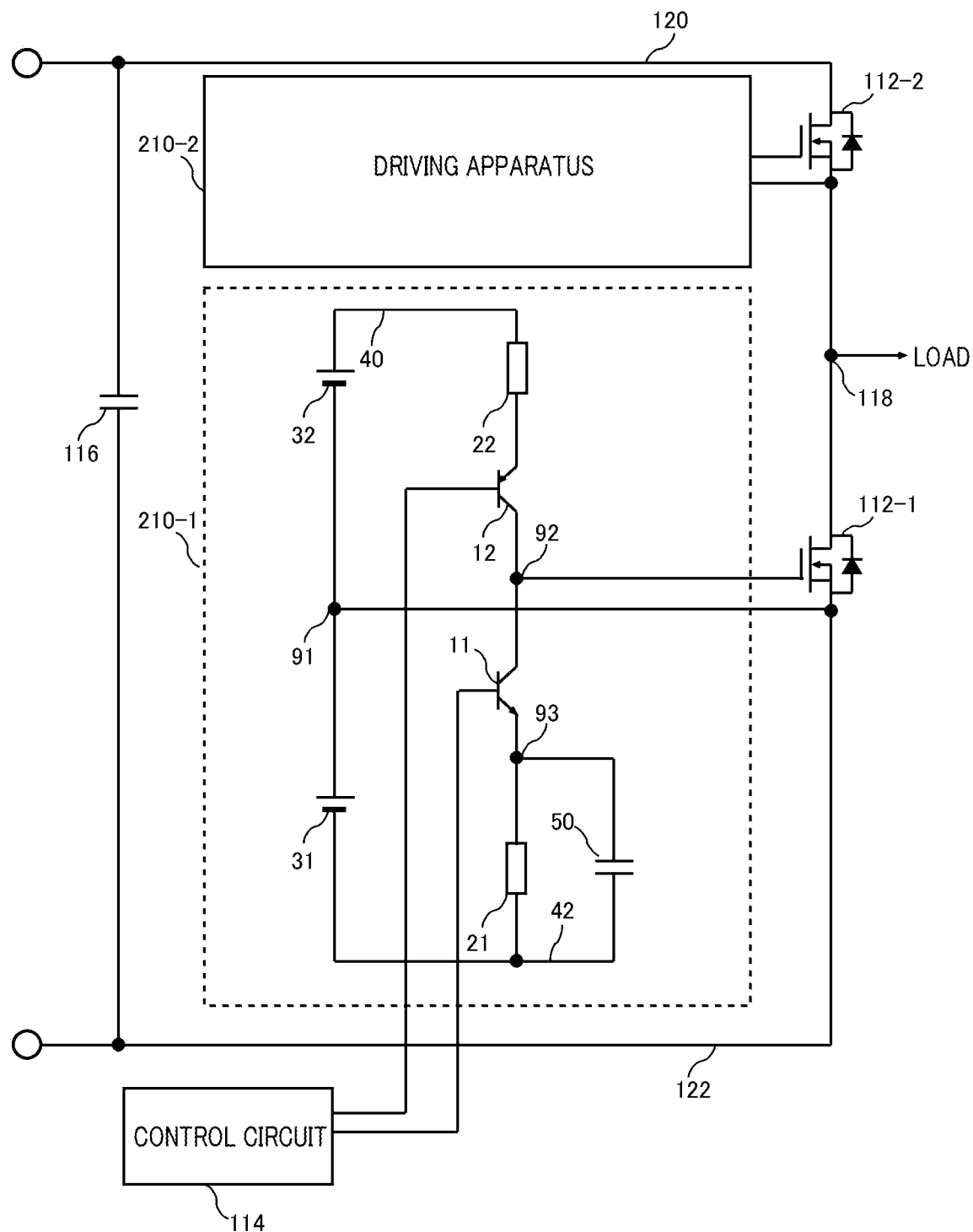
FIG. 1 is a diagram illustrating one example of a power supply circuit 200 according to a reference example.

FIG. 1 is a diagram illustrating one example of a power supply circuit 200 according to a reference example. The power supply circuit 200 is configured to supply power to a load. The power supply circuit 200 of the present example includes switching devices 112-1 and 112-2, driving apparatuses 210-1 and 210-2, a control circuit 114, a high potential line 120, and a reference potential line 122.

The switching device 112-1 and the switching device 112-2 are each a transistor such as a MOSFET as one example, but are not limited to this. Each of the switching devices 112 may have a drain terminal, a source terminal, and a gate terminal. When the switching device 112 is an insulated gate bipolar transistor (IGBT) or the like, the drain terminal and the source terminal may also be referred to as a collector terminal and an emitter terminal. The gate terminal is one example of a control terminal that controls an on/off state of the switching device 112.

The switching device 112-1 and the switching device 112-2 of the present example may be connected in series to each other between a high potential line 120 and a reference potential line 122. A reference potential such as a ground potential is applied to the reference potential line 122. A high potential higher than the reference potential is applied to the high potential line 120. An external power source may be connected to the reference potential line 122 and the high potential line 120. In addition, a capacitor 116 may be connected between the reference potential line 122 and the high potential line 120.

According to the present example, the drain terminal of the switching device 112-2 is connected to the high potential line 120, and the drain terminal of the switching device 112-1 is connected to the source terminal of the switching device 112-2. In addition, the source terminal of the switching device 112-1 is connected to the reference potential line 122.

The power supply circuit 200 supplies the power to the load from a connection point 118 of the switching device 112-1 and the switching device 112-2. The on/off states of the switching device 112-1 and the switching device 112-2 are mutually switched in a complementary manner. That is, when one of the switching devices 112 is in the on state, the other switching device 112 is controlled to be in the off state. With this configuration, whether the load is connected to the high potential line 120 or connected to the reference potential line 122 is switched.

A driving apparatus 210-1 controls the switching device 112-1 to switch the on state and the off state. A driving apparatus 210-2 controls the switching device 112-2 to switch the on state and the off state. The driving apparatus 210-2 may have a similar function and structure to the driving apparatus 210-1. According to the present example, the structure and operation of the driving apparatus 210-1 will be described, and description of the driving apparatus 210-2 will be omitted. In addition, in the present specification, the driving apparatus 210-1 may be simply referred to as the driving apparatus 210.

The driving apparatus 210 generates a control signal to be input to the gate terminal of the switching device 112. The driving apparatus 210 includes a first switching control unit 11, a second switching control unit 12, a first resistor element 21, a resistor element 22, a first power source 31, a second power source 32, and a first capacitor 50.

The first power source 31 and the second power source 32 are arranged in series to each other between a high potential line 40 and a reference potential line 42. The first power source 31 and the second power source 32 generate a voltage between the high potential line 40 and the reference potential line 42. A connection point 91 of the first power source 31 and the second power source 32 may be connected to the source terminal of the switching device 112.

The first switching control unit 11 and the second switching control unit 12 control switching of the on/off state of the switching device 112. The first switching control unit 11 and the second switching control unit 12 of the present example are transistors arranged in series to each other between the high potential line 40 and the reference potential line 42 and configured to operate in a complementary manner. Each of the transistors illustrated in the present specification and the drawings may be a bipolar transistor, may be a MOSFET, may be an IGBT, may be a wide bandgap semiconductor device using at least one of silicon carbide, gallium nitride, gallium oxide, and diamond as a main material, or may be another semiconductor switching device. A connection point 92 of the first switching control unit 11 and the second switching control unit 12 is connected to the control terminal (gate terminal) of the switching device 112.

The first switching control unit 11 controls whether to connect the control terminal of the switching device 112 to the reference potential line 42. According to the present example, when the first switching control unit 11 is in the on state, the control terminal of the switching device 112 is connected to the reference potential line 42. The second switching control unit 12 controls whether to connect the control terminal of the switching device 112 to the high potential line 40. According to the present example, when the second switching control unit 12 is in the on state, the control terminal of the switching device 112 is connected to the high potential line 40

The control circuit 114 controls the on/off states of the first switching control unit 11 and the second switching control unit 12. The control circuit 114 may generate control signals applied to control terminals of the first switching control unit 11 and the second switching control unit 12.

The first resistor element 21 is provided in series to the first switching control unit 11 in a path between the control terminal of the switching device 112 and the reference potential line 42. The first resistor element 21 of the present example is arranged between the first switching control unit 11 and the reference potential line 42, but may be arranged between the connection point 92 and the first switching control unit 11. When the first switching control unit 11 turns on, electric charge accumulated in a gate capacitance of the switching device 112 is drawn to the reference potential line 42 through the first resistor element 21. For this reason, a speed of turn-off by the switching device 112 is adjusted by a resistance value of the first resistor element 21, and a time rate of change (which may also be referred to as di/dt) of a main current (in the present example, a drain current Id) of the switching device 112 can be adjusted. Note that when the switching device 112 performs a turn-off operation, a surge voltage in accordance with the time rate of change of the main current of the switching device 112 is generated at main terminals (in the present example, the source terminal and the drain terminal) of the switching device 112.

The resistor element 22 is provided in series to the second switching control unit 12 in a path between the control terminal of the switching device 112 and the high potential line 40. The resistor element 22 of the present example is arranged between the second switching control unit 12 and the high potential line 40, but may be arranged between the connection point 92 and the second switching control unit 12. When the second switching control unit 12 turns on, the gate capacitance of the switching device 112 is charged with the electric charge from the high potential line 40 through the resistor element 22. For this reason, a speed of turn-on by the switching device 112 is adjusted by a resistance value of the resistor element 22, and the time rate of change (which may also be referred to as di/dt) of the main current (in the present example, the drain current Id) of the switching device 112 can be adjusted.

As described above, when the resistance value of the first resistor element 21 is increased, the surge voltage can be suppressed by decreasing the time rate of change of the main current. However, when the resistance value of the first resistor element 21 is increased, a discharge time of gate charge of the switching device 112 is lengthened, and a period of time (in the present specification, which will be referred to as a turn-off time) from start to completion of a turn-off operation of the switching device 112 is increased. For this reason, a turn-off loss of the switching device 112 is increased. Note that the completion of the turn-off may be timing at which interruption of the main current of the switching device 112 is completed, or timing at which a voltage between the main terminals after the generation of the surge voltage is matched with a voltage of the capacitor 116.

On the other hand, when the resistance value of the first resistor element 21 is decreased, the turn-off loss can be reduced by shortening the turn-off time of the switching device 112. However, the surge voltage is increased.

Since an operating frequency of a semiconductor device in recent years has been increased, the switching device 112 can preferably perform a high speed operation. To cause the switching device 112 to perform the high speed operation, suppression of the surge voltage and suppression of the turn-off time and the turn-off loss are preferably balanced.

The power supply circuit 200 includes the first capacitor 50 provided in parallel with the first resistor element 21 in a path from the control terminal of the switching device 112 to the reference potential line 42. The first capacitor 50 of the present example is provided in parallel with the first resistor element 21 between a connection point 93 of the first switching control unit 11 and the first resistor element 21 and the reference potential line 42.

When the first capacitor 50 is provided, immediately after the first switching control unit 11 is put into the on state, the gate charge of the switching device 112 is moved to the first capacitor 50 via the first switching control unit 11. In this case, the gate charge does not pass through the first resistor element 21. For this reason, the gate voltage of the switching device 112 promptly falls. For this reason, the turn-off time of the switching device 112 can be shortened.

After the first capacitor 50 is sufficiently charged with the electric charge, the gate charge of the switching device 112 is moved to the reference potential line 42 mainly through the first switching control unit 11 and the first resistor element 21. For this reason, the time rate of change of the main current can be adjusted by the first resistor element 21, and the surge voltage can be suppressed.

In this manner, when the first capacitor 50 is provided, the turn-off time of the switching device 112 is shortened, and also, the surge voltage can be suppressed. However, in a case where turn-on and turn-off of the switching device 112 are repeated, when the electric charge accumulated in the first capacitor 50 at the time of the previous turn-off is not sufficiently discharged by the next turn-off, the sufficient gate charge cannot be moved to the first capacitor 50 at the time of the next turn-off. In this case, the turn-off time cannot be shortened.

According to the present example, the first resistor element 21 also functions as a discharge circuit of the first capacitor 50. Thus, the electric charge accumulated in the first capacitor 50 is discharged via the first resistor element 21. For this reason, when the resistance value of the first resistor element 21 is increased for a purpose of suppressing the surge voltage, the discharge of the accumulated charge of the first capacitor 50 is slowed down, and a case may occur that the accumulated charge cannot be sufficiently discharged by the next turn-off. In particular, when the switching device 112 performs the high speed operation, the discharge of the first capacitor 50 might be too late. When the resistance value of the first resistor element 21 is decreased, the discharge time of the first capacitor 50 is shortened, but it becomes difficult to suppress the surge voltage.

Figure 2:
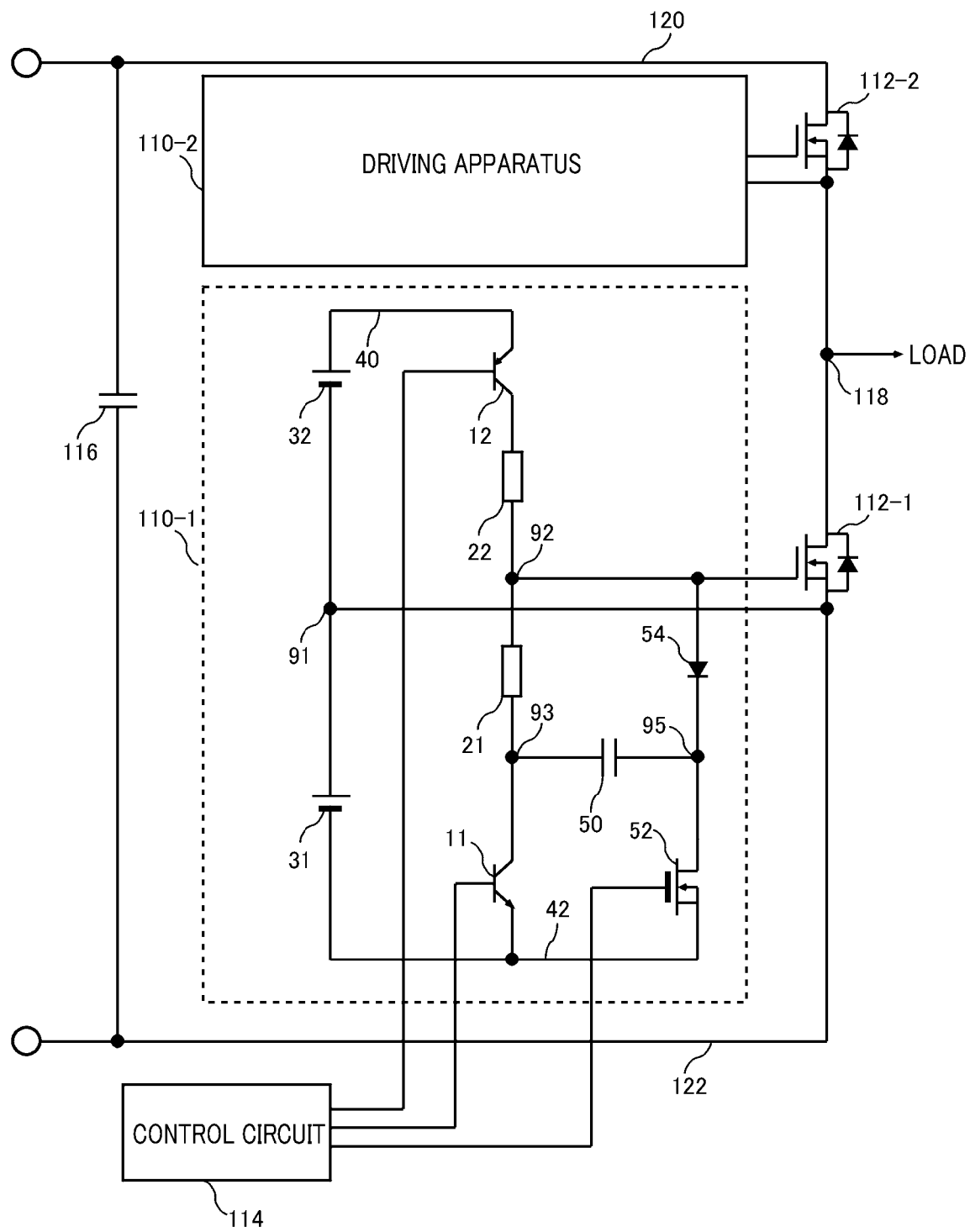
FIG. 2 is a diagram illustrating a configuration example of the power supply circuit 100 according to one embodiment of the present invention.

FIG. 2 is a diagram illustrating a configuration example of a power supply circuit 100 according to one embodiment of the present invention. The power supply circuit 100 includes driving apparatuses 110-1 and 110-2 instead of the driving apparatuses 210-1 and 210-2 illustrated in FIG. 1. A configuration other than the driving apparatus 110 is similar to the power supply circuit 200 illustrated in FIG. 1. The driving apparatus 110-2 has a similar function and configuration to the driving apparatus 110-1. According to the present example, a structure and operation of the driving apparatus 110-1 will be described, and description of the driving apparatus 110-2 will be omitted. In addition, in the present specification, the driving apparatus 110-1 may be simply referred to as the driving apparatus 110.

The driving apparatus 110 is configured to drive the switching device 112. Similarly as in the driving apparatus 210, the driving apparatus 110 includes the first power source 31, the second power source 32, the first switching control unit 11, the second switching control unit 12, the first resistor element 21, the resistor element 22, and the first capacitor 50. In the example of FIG. 2, the first resistor element 21 is arranged between the connection point 92 and the first switching control unit 11, and the resistor element 22 is arranged between the connection point 92 and the second switching control unit 12. In another example, the first resistor element 21 may be arranged between the first switching control unit 11 and the reference potential line 42. In addition, the resistor element 22 may be arranged between the second switching control unit 12 and the high potential line 40.

The first capacitor 50 is provided in parallel with the first resistor element 21 in the path from the control terminal of the switching device 112 to the reference potential line 42. The first capacitor 50 of the present example is arranged in parallel with the first resistor element 21 between the control terminal of the switching device 112 and the first switching control unit 11 (or the connection point 93). The connection point 93 is a connection point of the first resistor element 21 and the first switching control unit 11.

The driving apparatus 110 further includes a discharge control unit 52 configured to control whether to discharge the first capacitor 50. The discharge control unit 52 is provided to be separate from the first switching control unit 11. The discharge control unit 52 of the present example is a first transistor configured to switch whether to connect an electrode on the switching device 112 side of the first capacitor 50 to the reference potential line 42. When the first switching control unit 11 is in the on state and also the discharge control unit 52 is put into the on state, both ends of the first capacitor 50 are connected to the reference potential line 42. With this configuration, the first capacitor 50 is discharged without the intermediation of the first resistor element 21. Note that on resistances of the first switching control unit 11 and the discharge control unit 52 are sufficiently smaller than the first resistor element 21.

The discharge control unit 52 is put into the on state after the timing at which the first switching control unit 11 is put into the on state. With this configuration, during a predetermined period since the first switching control unit 11 is put into the on state, the gate charge of the switching device 112 is moved to the first capacitor 50, and the gate voltage of the switching device 112 promptly falls. For this reason, the turn-off time of the switching device 112 can be shortened. Then, since the discharge control unit 52 is put into the on state, the accumulated charge of the first capacitor 50 is discharged without the intermediation of the first resistor element 21. With this configuration, the accumulated charge of the first capacitor 50 can be promptly discharged, and even when the switching device 112 performs the high speed operation, the discharge of the first capacitor 50 can be sufficiently performed. In addition, the surge voltage can be suppressed by adjusting the resistance value of the first resistor element 21.

The control circuit 114 may control the on/off state of the discharge control unit 52. The control circuit 114 may control the discharge control unit 52 based on the timing at which the first switching control unit 11 is put into the on state. For example, the discharge control unit 52 may be put into the on state after a predetermined period of time elapses since the first switching control unit 11 is put into the on state. In addition, the control circuit 114 may control the discharge control unit 52 based on a state of any of the driving apparatus 110-1, the driving apparatus 110-2, the switching device 112-1, and the switching device 112-2. A state of each of the apparatuses and the devices may be an instantaneous value or a temporal waveform of a voltage or a current in a predetermined position on a circuit.

The driving apparatus 110 may further include a first diode 54. The first diode 54 is arranged in parallel with the first resistor element 21 between the control terminal of the switching device 112 and the first capacitor 50. The first diode 54 is arranged such that a direction from the switching device 112 towards the first capacitor 50 is set as a forward direction. When the first diode 54 is provided, the discharge of the accumulated charge of the first capacitor 50 via the first resistor element 21 can be avoided. The discharge control unit 52 of the present example is arranged between a connection point 95 of the first diode 54 and the first capacitor 50 and the reference potential line 42.

Figure 3:
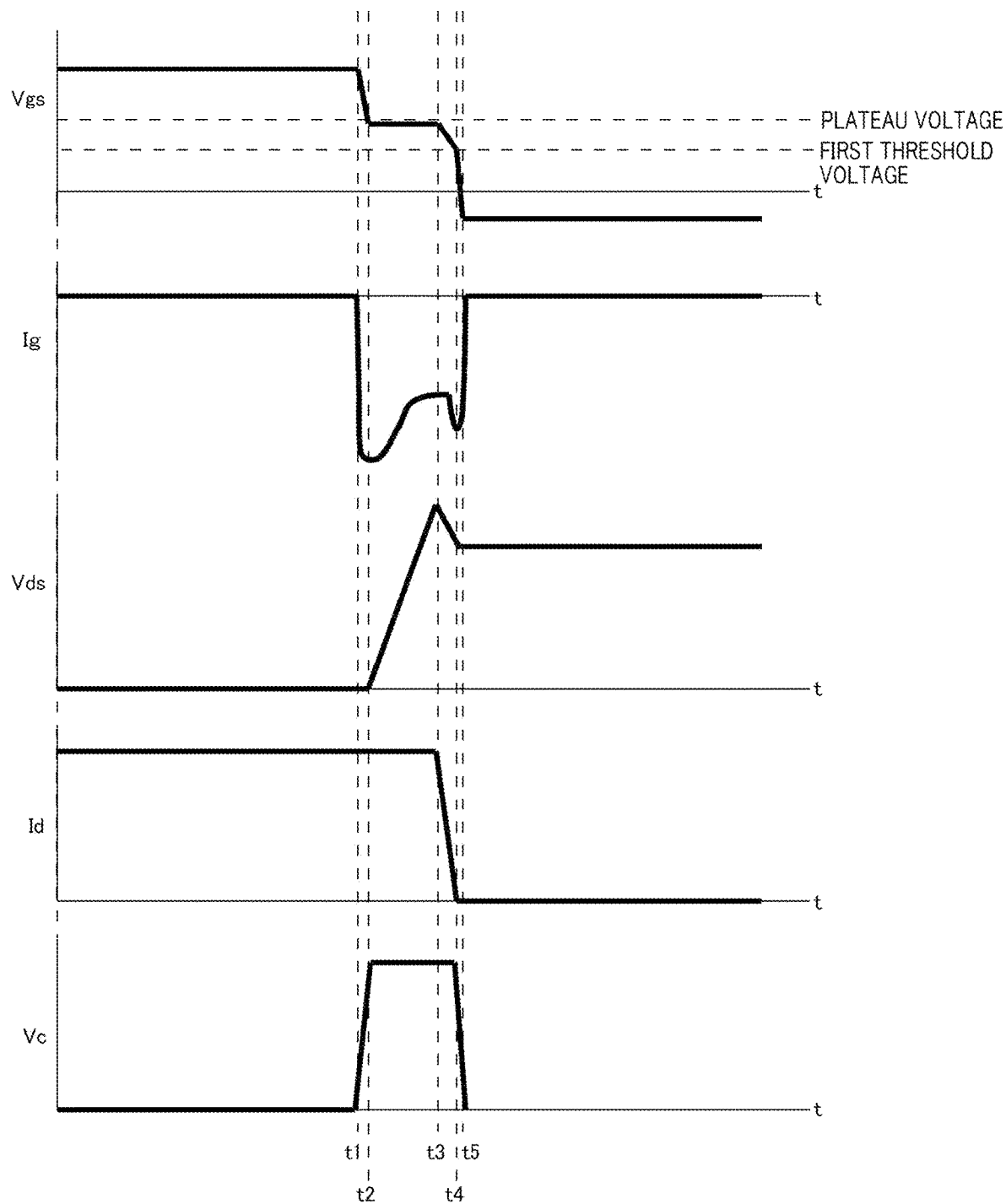
FIG. 3 is a diagram illustrating an operation example of a switching device 112-1 and a driving apparatus 110-1.

FIG. 3 is a drawing illustrating an operation example of the switching device 112-1 and the driving apparatus 110-1.

A horizontal axis in FIG. 3 represents time, and a vertical axis represents a magnitude of a voltage or a current. In addition, the gate voltage (gate-source voltage) of the switching device 112 is denoted by Vgs, a gate current is denoted by Ig, the voltage between the main terminals is denoted by Vds, the main current is denoted by Id, and a voltage of the first capacitor 50 is denoted by Vc.

In an initial state of FIG. 3, the switching device 112 is in the on state. At timing t1, the first switching control unit 11 shifts from the off state to the on state. With this configuration, the gate current Ig flows, and the gate charge of the switching device 112 is moved to the first capacitor 50. The gate voltage Vgs promptly falls, and the capacitor voltage Vc rises. In FIG. 3, the gate current Ig flowing to the control terminal of the switching device 112 is set as positive, and the gate current Ig flowing from the control terminal is set as negative. The gate charge is moved to the first capacitor 50 until timing t2 at which the gate voltage Vgs falls to a plateau voltage of the switching device 112. The plateau voltage will be described below. The first capacitor 50 may have a capacitance in which the gate charge can be moved and accumulated such that the gate voltage Vgs of the switching device 112 is matched with the plateau voltage, or may have a capacitance in which the gate charge can be moved and accumulated such that the gate voltage Vgs of the switching device 112 turns to the plateau voltage. That is, the capacitance of the first capacitor 50 may be a capacitance or larger in which a total amount of the moved gate charge can be accumulated when the gate charge is moved from the switching device 112 such that the gate voltage Vgs of the switching device 112 is matched with the plateau voltage.

When the gate voltage Vgs falls to the plateau voltage and thereafter (at t2 and thereafter), the gate charge of the switching device 112 flows to the reference potential line 42 through the first resistor element 21 and the first switching control unit 11. The gate current Ig is relatively decreased by the resistance value of the first resistor element 21. In addition, the voltage Vds between the main terminals gradually rises since the switching device 112 starts to turn off.

When a predetermined period elapses since the gate voltage Vgs falls to the plateau voltage, the gate voltage Vgs starts to be lower than the plateau voltage (timing t3). For example, when discharge of electric charge of a feedback capacitance Crss (or a gate-drain capacitance Cgd) of the switching device 112 is finished, the gate voltage Vgs starts to fall. A duration of a period from t2 to t3 may be 0. The time rate of change (di/dt) of the main current Id affecting a magnitude of the surge voltage is determined by a magnitude of the gate current Ig during the period from t2 to t3. According to the present example, since the gate current Ig during the period can be adjusted by the first resistor element 21, the surge voltage can be suppressed.

According to the embodiment of FIG. 2, the discharge control unit 52 discharges the first capacitor 50 at predetermined timing t4 at or after the timing t3. In the example of FIG. 3, the discharge control unit 52 is put into the on state under a condition that the gate voltage Vgs is lower than or equal to a first threshold voltage. The first threshold voltage is lower than the plateau voltage. With this configuration, since the capacitor voltage Vc promptly falls, even when the switching device 112 performs the high speed operation, the first capacitor 50 can be sufficiently discharged. In addition, the gate current Ig of the switching device 112 also flows to the reference potential line 42 through the discharge control unit 52. For this reason, it is possible to cause the gate voltage Vgs to promptly fall. Note that, the gate current Ig is increased when the discharge control unit 52 is put into the on state at the timing t4, which however does not affect the magnitude of the surge voltage generated at the timing t3.

As described above, according to the embodiment illustrated in FIG. 2 and FIG. 3, it is possible to provide the driving apparatus 110 that balances the suppression of the surge voltage of the switching device 112 and the shortening of the turn-off time and further can cope with the increase in the operating frequency of the switching device 112.

Note that the plateau voltage may be a voltage that satisfies at least any one or more of the following conditions (1) to (3).

(1) The gate-source voltage Vgs in a region between inflexion points on a gate charge-Vgs characteristic curve of the switching device 112.

(2) The gate voltage Vgs during a period in which the main current Id does not change but the drain-source voltage Vds changes in a switching operation of the switching device.

(3) The gate voltage Vgs while the feedback capacitance Crss (or the gate-drain capacitance Cgd) in the MOSFET is discharged. When a specification value of the plateau voltage is set by a manufacturer or the like of the switching device 112, the specification value may be used.

In addition, the first threshold voltage may be a voltage defined by any of the following (4) to (6), and when a specification value of a threshold voltage is set by the manufacturer or the like of the switching device 112, the specification value may be used.

(4) The gate voltage Vgs in a case where the main current Id is 0. The case where the main current Id is 0 includes a case where the main current Id turns to substantially 0 like a case where the main current is lower than or equal to measuring power of measurement equipment.

(5) The gate voltage Vgs in a case where the main current Id that is 0.1% of a rated current of the switching device 112 flows. It is sufficient when the value of the main current Id used herein is sufficiently lower than the rated current as in 1% or below, and is not limited to 0.1% of the rated current.

(6) The gate voltage Vgs in a case where the main current Id flowing to the switching device 112 is equal to a leakage current at the time of interruption in the off state. The case where the main current is equal to the leakage current at the time of interruption includes a case where the main current is substantially equal to the leakage current at the time of interruption like a case where a difference is lower than or equal to the measuring power of the measurement equipment.

At the timing t4 and thereafter, since the discharge control unit 52 is in the on state, a short-circuit state equivalently occurs between the gate and the source of the switching device 112. For this reason, the gate-source voltage Vgs of the switching device 112 is fixed to a reverse bias voltage, and it is possible to avoid a situation where the switching device 112 is erroneously put into the on state. For this reason, the discharge control unit 52 also functions as an active mirror clamp circuit that avoids the erroneous on state of the switching device 112.

Therefore, it is sufficient when the discharge of the first capacitor 50 is completed at latest by the next turn-on of the switching device. By the next turn-on of the switching device, the first capacitor 50 may be discharged during a dead time period of the pair of switching devices 112-1 and 112-2 configured to operate in a complementary manner. The dead time period refers to a period in which both the switching devices 112 are in the off state (or controlled to be put in the off state).

Note that the discharge control unit 52 can also function as the active mirror clamp circuit by turning on the discharge control unit 52 at timing at which the gate voltage of the switching device is lower than the first threshold voltage.

The control circuit 114 may control the discharge control unit 52 based on at least one of the gate voltage Vgs, the gate current Ig, the voltage Vds between the main terminals, and the main current Id. Based on at least one of these, the control circuit 114 may estimate the timing t3 at which the gate voltage Vgs starts to be lower than the plateau voltage. For example, the control circuit 114 may detect timing at which the voltage Vds between the main terminals indicates a peak as t3, and may also detect timing at which the main current Id starts to fall from a steady state value as t3. The control circuit 114 may control the discharge control unit 52 to be in the on state at predetermined timing at or after the timing t3.

Figure 4:
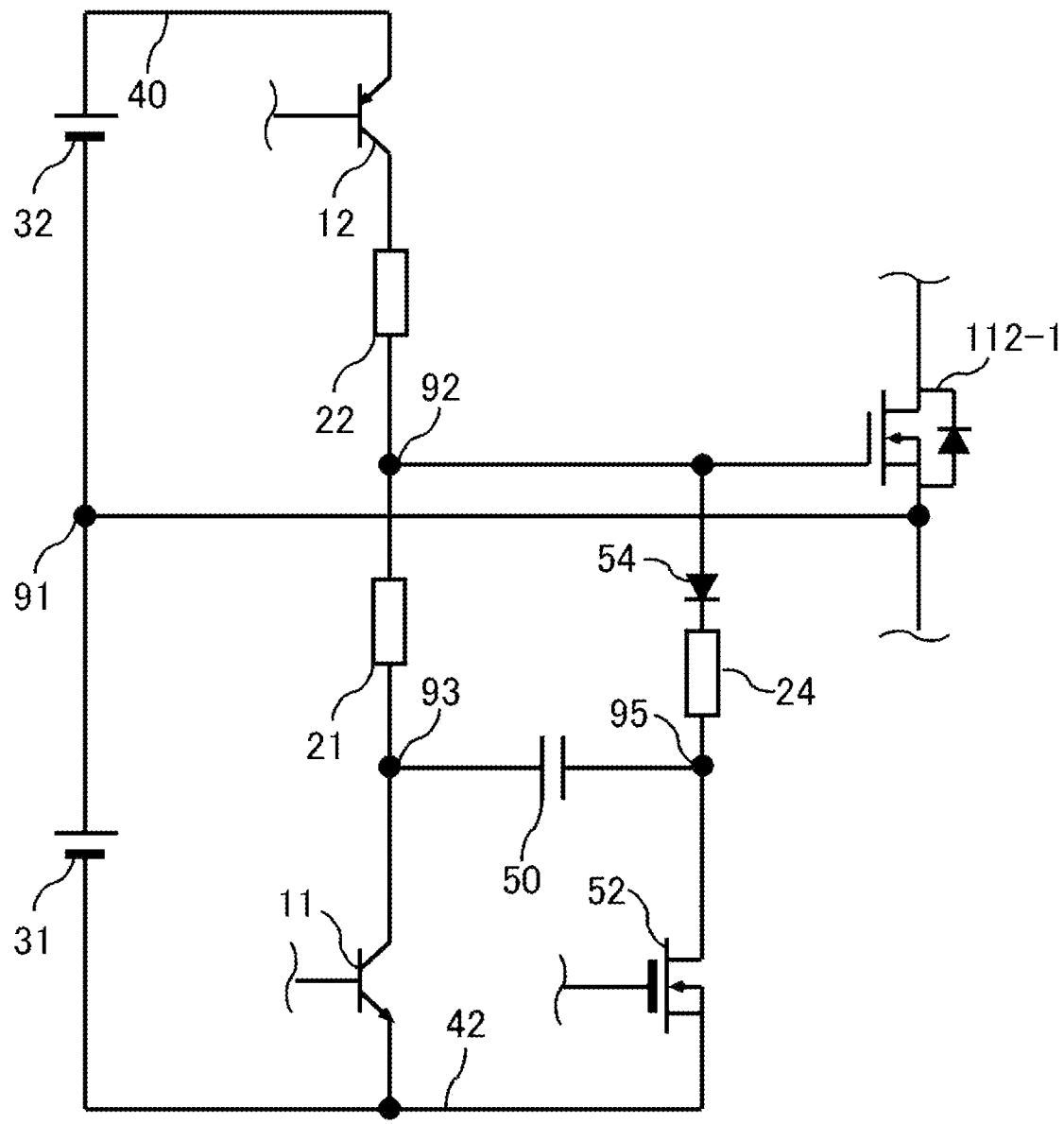
FIG. 4 is a diagram illustrating another configuration example of a driving apparatus 110.

FIG. 4 is a diagram illustrating another configuration example of the driving apparatus 110. The driving apparatus 110 of the present example further includes a second resistor element 24 in addition to the configuration of the driving apparatus 110 described with reference to FIG. 2. The second resistor element 24 is arranged in series to the first diode 54 between the connection point 95 of the first capacitor 50 and the discharge control unit 52 and the control terminal of the switching device 112. In the example of FIG. 4, the second resistor element 24 is arranged between the first diode 54 and the connection point 95, but in another example, the second resistor element 24 may be arranged between the first diode 54 and the control terminal of the switching device 112. When the second resistor element 24 is arranged in this manner, a discharge speed of the first capacitor 50 is not decreased, and it is possible to set a current flowing to the first diode 54 to be within a limit value of the first diode 54.

When the second resistor element 24 is provided, the current flowing to the first diode 54 can be adjusted. For example, when the second resistor element 24 is provided, it is possible to avoid a situation where a current exceeding the rated value flows to the first diode 54. Note that, to shorten the turn-off time, a resistance value of the second resistor element 24 is preferably lower than the resistance value of the first resistor element 21.

In addition, when the resistance value of the second resistor element 24 is adjusted, the current flowing to the first capacitor 50 from the control terminal of the switching device 112 can be adjusted. With this configuration, the time rate of change of the voltage Vds between the main terminals can be adjusted. Furthermore, when the resistance value of the first resistor element 21 is adjusted, the current flowing to the reference potential line 42 from the control terminal of the switching device 112 through the first resistor element 21 and the first switching control unit 11 can be adjusted. With this configuration, the time rate of change of the main current Id can be adjusted. That is, in the present example, since the first resistor element 21 and the second resistor element 24 are separately adjusted, it is possible to independently adjust the time rate of change of the voltage Vds between the main terminals and the time rate of change of the main current Id. With this configuration, the switching speed can be increased without increasing the surge voltage, and the switching loss can be reduced.

Figure 5:
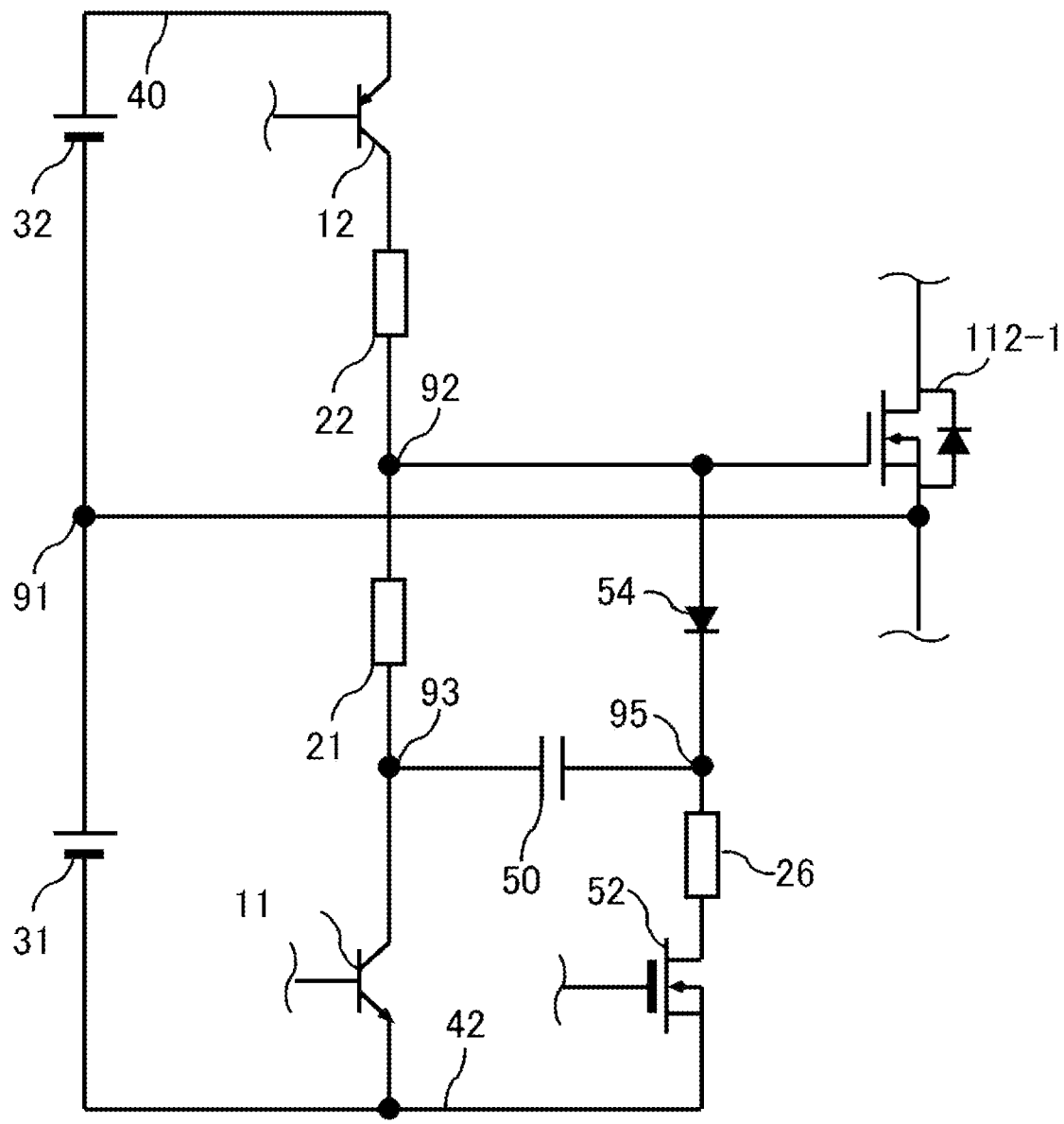
FIG. 5 is a diagram illustrating another configuration example of the driving apparatus 110.

FIG. 5 is a diagram illustrating another configuration example of the driving apparatus 110. The driving apparatus 110 of the present example further includes a third resistor element 26 in addition to the configuration of any of the driving apparatuses 110 described with reference to FIG. 2 to FIG. 4. As illustrated in FIG. 4, the driving apparatus 110 may include the second resistor element 24. The third resistor element 26 is arranged in series to the discharge control unit 52 between the connection point 95 and the reference potential line 42. In the example of FIG. 5, the third resistor element 26 is arranged between the discharge control unit 52 and the connection point 95, but in another example, the third resistor element 26 may be arranged between the discharge control unit 52 and the reference potential line 42. In this manner, when the third resistor element 26 is arranged, it is possible to set the current flowing to the discharge control unit 52 to be within a limit value of the discharge control unit 52 without lengthening the turn-off time.

When the third resistor element 26 is provided, the current flowing to the discharge control unit 52 can be adjusted. For example, when the third resistor element 26 is provided, it is possible to avoid a situation where a current exceeding the rated value flows to the discharge control unit 52. Note that, to shorten the turn-off time, a resistance value of the third resistor element 26 is preferably lower than the resistance value of the first resistor element 21.

Figure 6:
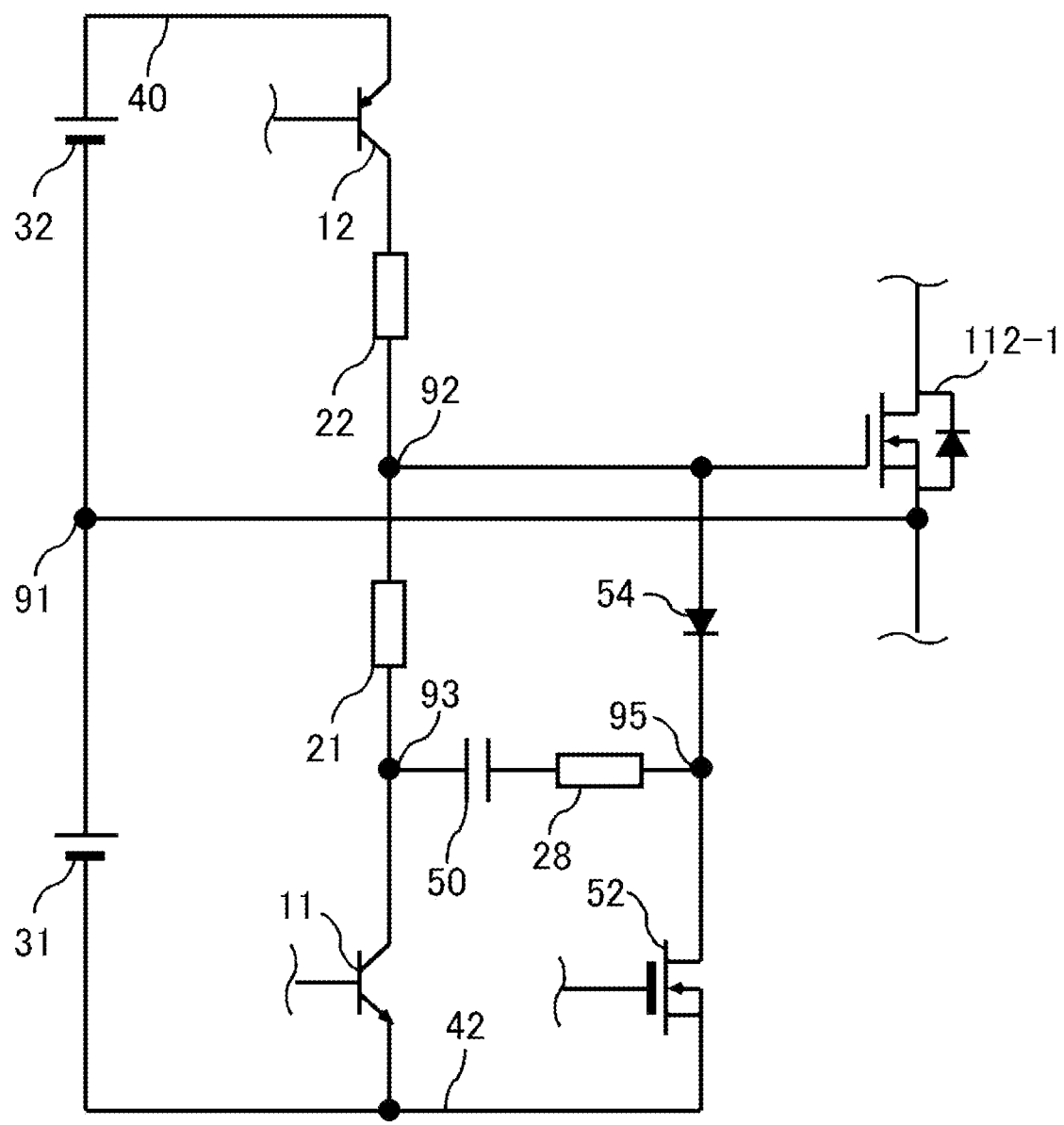
FIG. 6 is a diagram illustrating another configuration example of the driving apparatus 110.

FIG. 6 is a diagram illustrating another configuration example of the driving apparatus 110. The driving apparatus 110 of the present example further includes a fourth resistor element 28 in addition to the configuration of any of the driving apparatuses 110 described with reference to FIG. 2 to FIG. 5. As illustrated in FIG. 4 and FIG. 5, the driving apparatus 110 may include at least one of the second resistor element 24 and the third resistor element 26. The fourth resistor element 28 is arranged in series to the first capacitor 50 between the connection point 93 and the connection point 95. In the example of FIG. 6, the fourth resistor element 28 is arranged between the connection point 95 and the first capacitor 50, but in another example, the fourth resistor element 28 may be arranged between the connection point 93 and the first capacitor 50. When the fourth resistor element 28 is arranged in this manner, it is possible to set the current flowing to the first capacitor 50 to be within the limit value of the first capacitor 50 without reducing an effect of the active mirror clamp circuit included in the discharge control unit 52.

When the fourth resistor element 28 is provided, the current flowing to the first capacitor 50 can be adjusted. For example, when the fourth resistor element 28 is provided, it is possible to avoid a situation where a current exceeding the rated value flows to the first capacitor 50 or the first diode 54. Note that, to shorten the turn-off time, a resistance value of the fourth resistor element 28 is preferably lower than the resistance value of the first resistor element 21.

In addition, when the resistance value of the fourth resistor element 28 is adjusted, the current flowing to the first capacitor 50 from the control terminal of the switching device 112 can be adjusted. With this configuration, the time rate of change of the voltage Vds between the main terminals can be adjusted. Furthermore, when the resistance value of the first resistor element 21 is adjusted, the current flowing to the reference potential line 42 from the control terminal of the switching device 112 through the first resistor element 21 and the first switching control unit 11 can be adjusted. With this configuration, the time rate of change of the main current Id can be adjusted. That is, in the present example, when the first resistor element 21 and the fourth resistor element 28 are separately adjusted, the time rate of change of the voltage Vds between the main terminals and the time rate of change of the main current Id can be independently adjusted. With this configuration, the switching speed can be increased without increasing the surge voltage, and the switching loss can be reduced.

Figure 7:
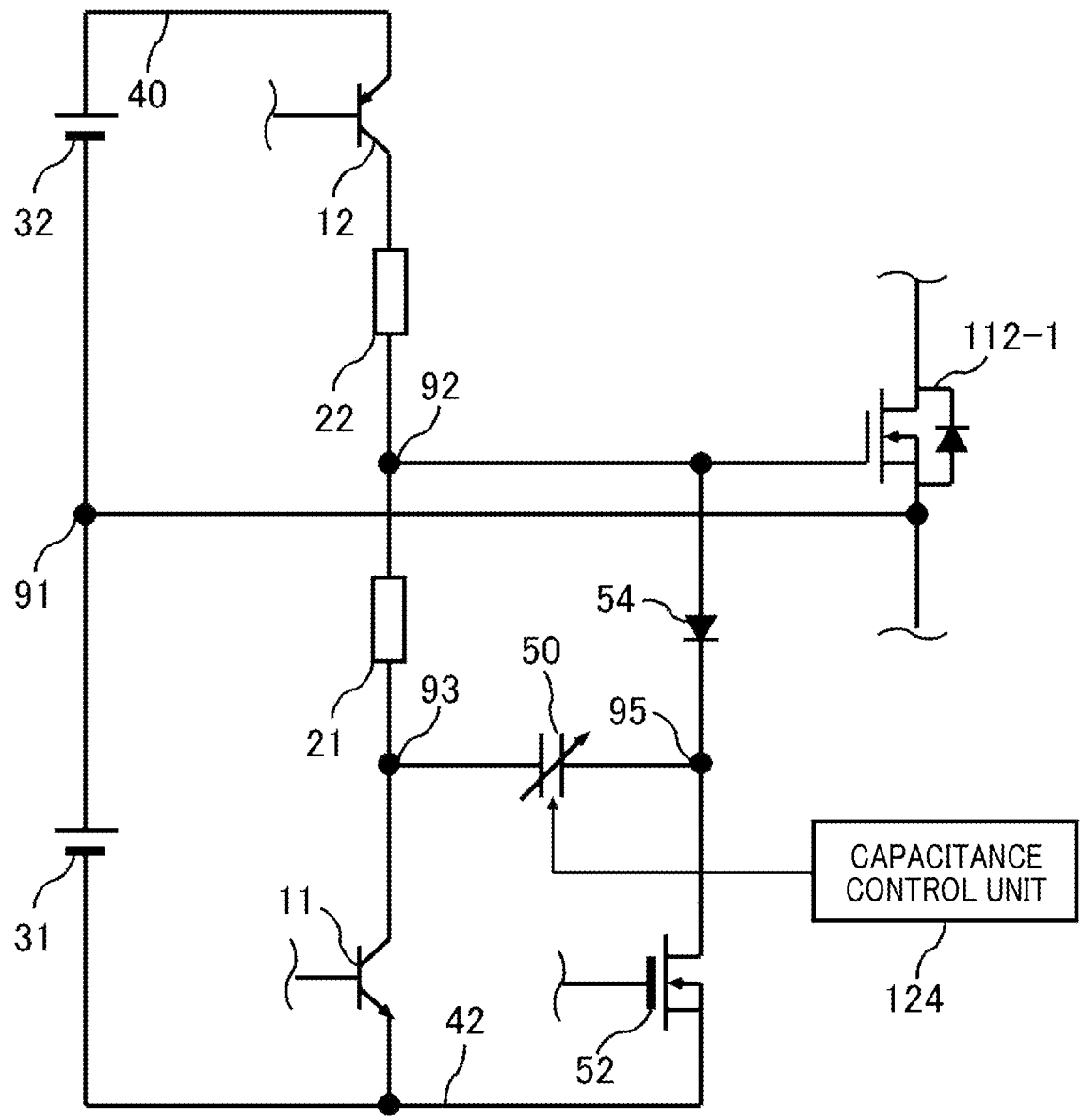
FIG. 7 is a diagram illustrating another configuration example of the driving apparatus 110.

FIG. 7 is a diagram illustrating another configuration example of the driving apparatus 110. With regard to the driving apparatus 110 of the present example, in the configuration of any of the driving apparatuses 110 described with reference to FIG. 2 to FIG. 6, the capacitance of the first capacitor 50 is variable. In addition, the driving apparatus 110 may include a capacitance control unit 124 configured to control the capacitance of the first capacitor 50. A configuration other than the first capacitor 50 and the capacitance control unit 124 is similar to any of the examples described with reference to FIG. 2 to FIG. 6.

The capacitance control unit 124 may adjust the capacitance of the first capacitor 50 such that a period from t1 to t3 illustrated in FIG. 3 approaches 0. With this configuration, the timing t3 at which the gate voltage Vgs turns to be lower than the plateau voltage can be expedited, and the turn-off time of the switching device 112 can be shortened.

For example, when the capacitance of the first capacitor 50 is increased, the still more gate charge can be moved to the first capacitor 50. During the period from t2 to t3, since the gate charge that is not moved to the first capacitor 50 is discharged via the first resistor element 21, the period from t2 to t3 can be shortened by increasing the capacitance of the first capacitor 50. It is noted however that when the capacitance of the first capacitor 50 is set to be too large, since the large gate current Ig flows even after the voltage Vds between the main terminals rises, the surge voltage is increased.

The capacitance control unit 124 may adjust the capacitance of the first capacitor 50 in such a range that the surge voltage is not increased. The capacitance control unit 124 may adjust the capacitance of the first capacitor 50 using operation information of the circuit (such as the gate voltage Vgs, the gate current Ig, the voltage Vds between the main terminals, the main current Id, and the capacitor voltage Vc), control information of a driving target device (such as an on time and an off time of the driving target device, and a signal to be input to the driving apparatus 110 from the control circuit 114). In addition, the capacitance of the first capacitor 50 may be adjusted such that the period from t2 to t3 shortened.

Figure 8:
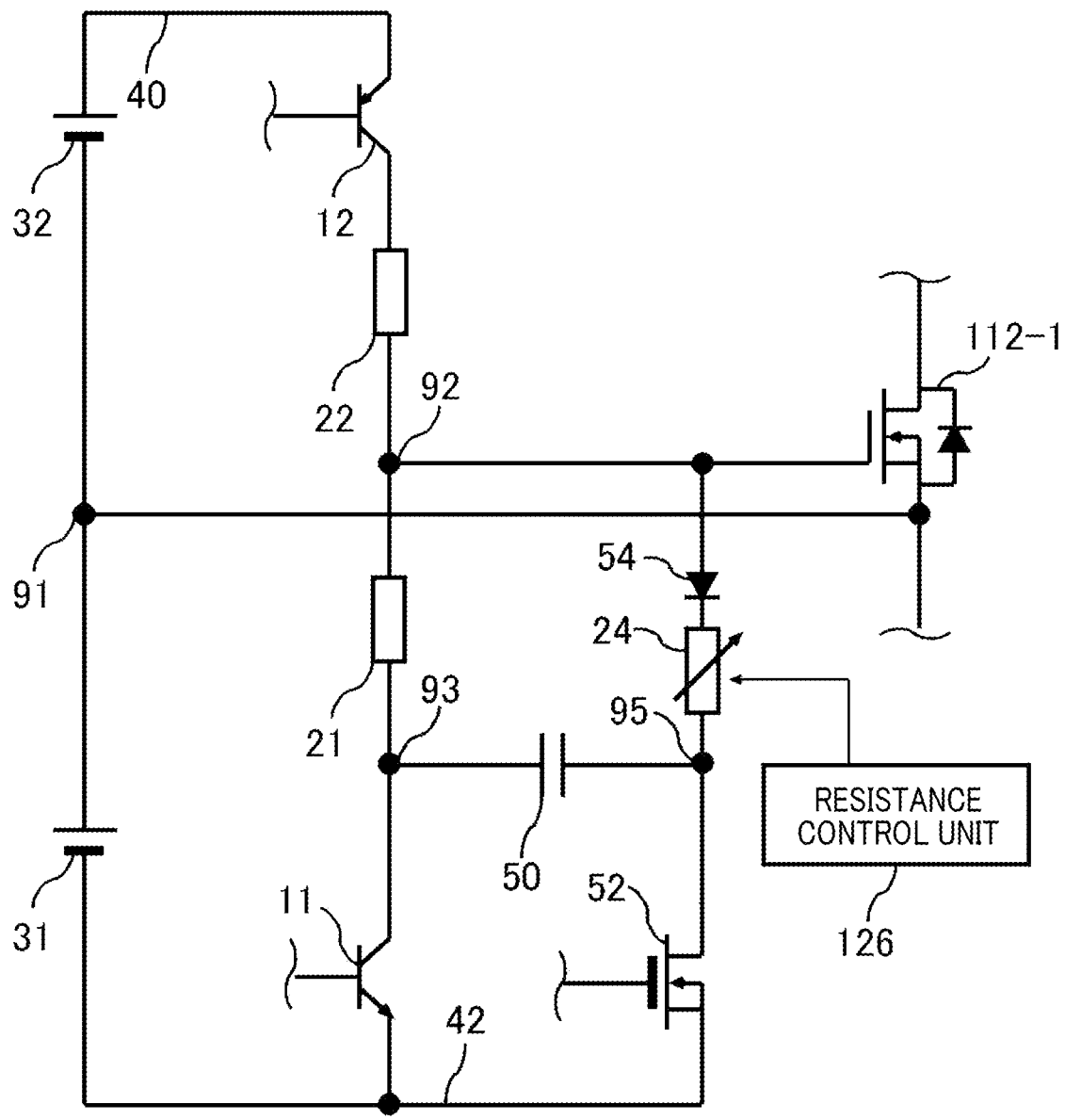
FIG. 8 is a diagram illustrating another configuration example of the driving apparatus 110.

FIG. 8 is a diagram illustrating another configuration example of the driving apparatus 110. With regard to the driving apparatus 110 of the present example, in the configuration of the driving apparatus 110 illustrated in FIG. 4, the resistance value of the second resistor element 24 is variable. In addition, the driving apparatus 110 may include a resistance control unit 126 configured to control the resistance value of the second resistor element 24. A configuration other than the second resistor element 24 and the resistance control unit 126 is similar to the example described with reference to FIG. 4.

According to the present example, the current flowing to the first diode 54 can be adjusted. In addition, when the resistance value of the second resistor element 24 is adjusted, the current flowing to the first capacitor 50 from the control terminal of the switching device 112 and the current flowing to the reference potential line 42 from the control terminal of the switching device 112 via the discharge control unit 52 can be adjusted. The resistance control unit 126 may adjust the resistance value of the second resistor element 24 such that a conduction current of the first diode 54 is set to be within a limit value.

Figure 9:
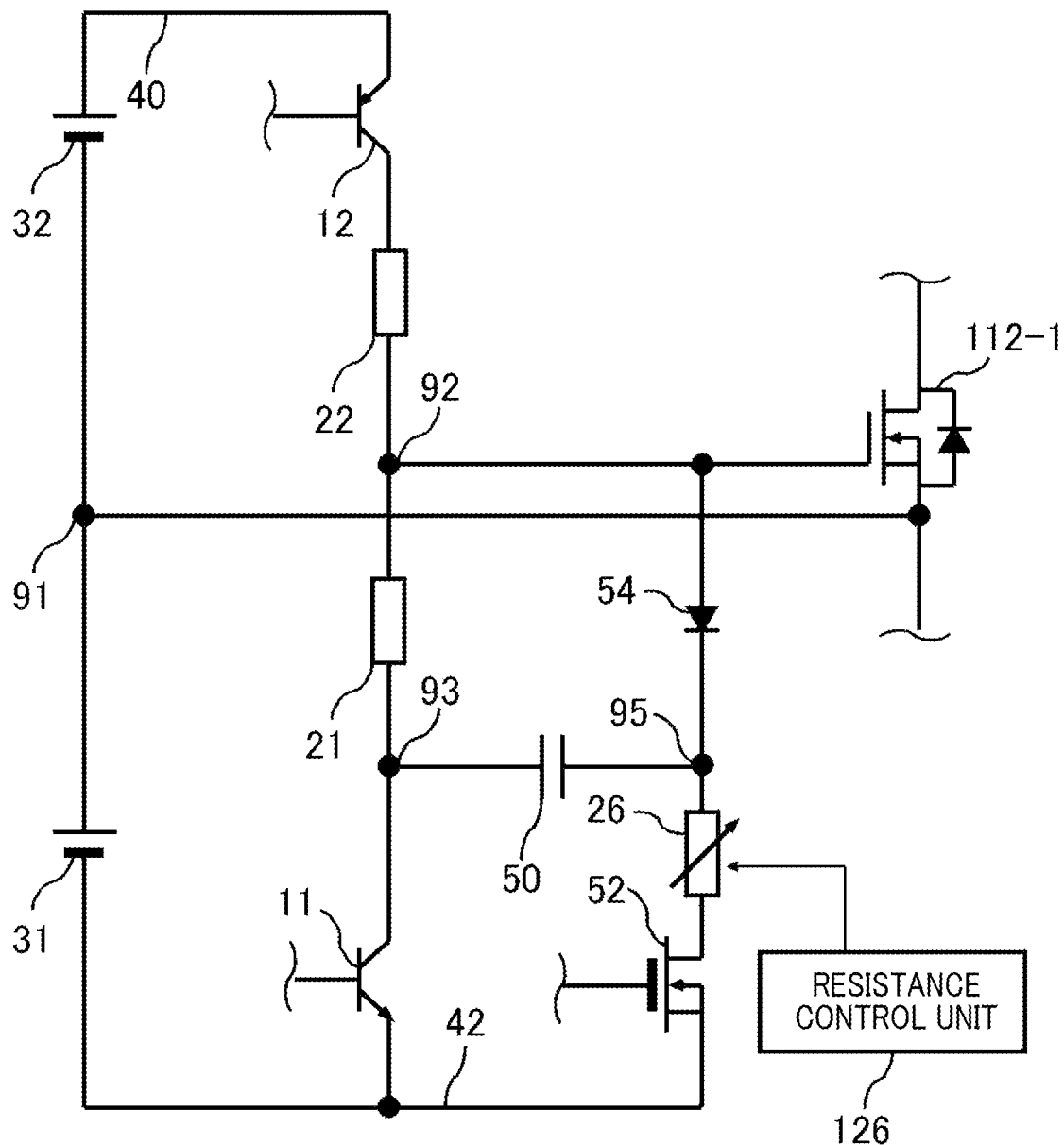
FIG. 9 is a diagram illustrating another configuration example of the driving apparatus 110.

FIG. 9 is a diagram illustrating another configuration example of the driving apparatus 110. With regard to the driving apparatus 110 of the present example, in the configuration of the driving apparatus 110 illustrated in FIG. 5, the resistance value of the third resistor element 26 is variable. In addition, the driving apparatus 110 may include the resistance control unit 126 configured to control the resistance value of the third resistor element 26. A configuration other than the third resistor element 26 and the resistance control unit 126 is similar to the example described with reference to FIG. 5.

According to the present example, the current flowing to the discharge control unit 52 can be adjusted. In addition, when the resistance value of the third resistor element 26 is adjusted, the current flowing to the reference potential line 42 from the first capacitor 50 and the current flowing to the reference potential line 42 from the switching device 112 via the third resistor element 26 can be adjusted. The resistance control unit 126 may adjust the resistance value of the third resistor element 26 such that the conduction current of the first diode 54 is set to be within the limit value.

Figure 10:
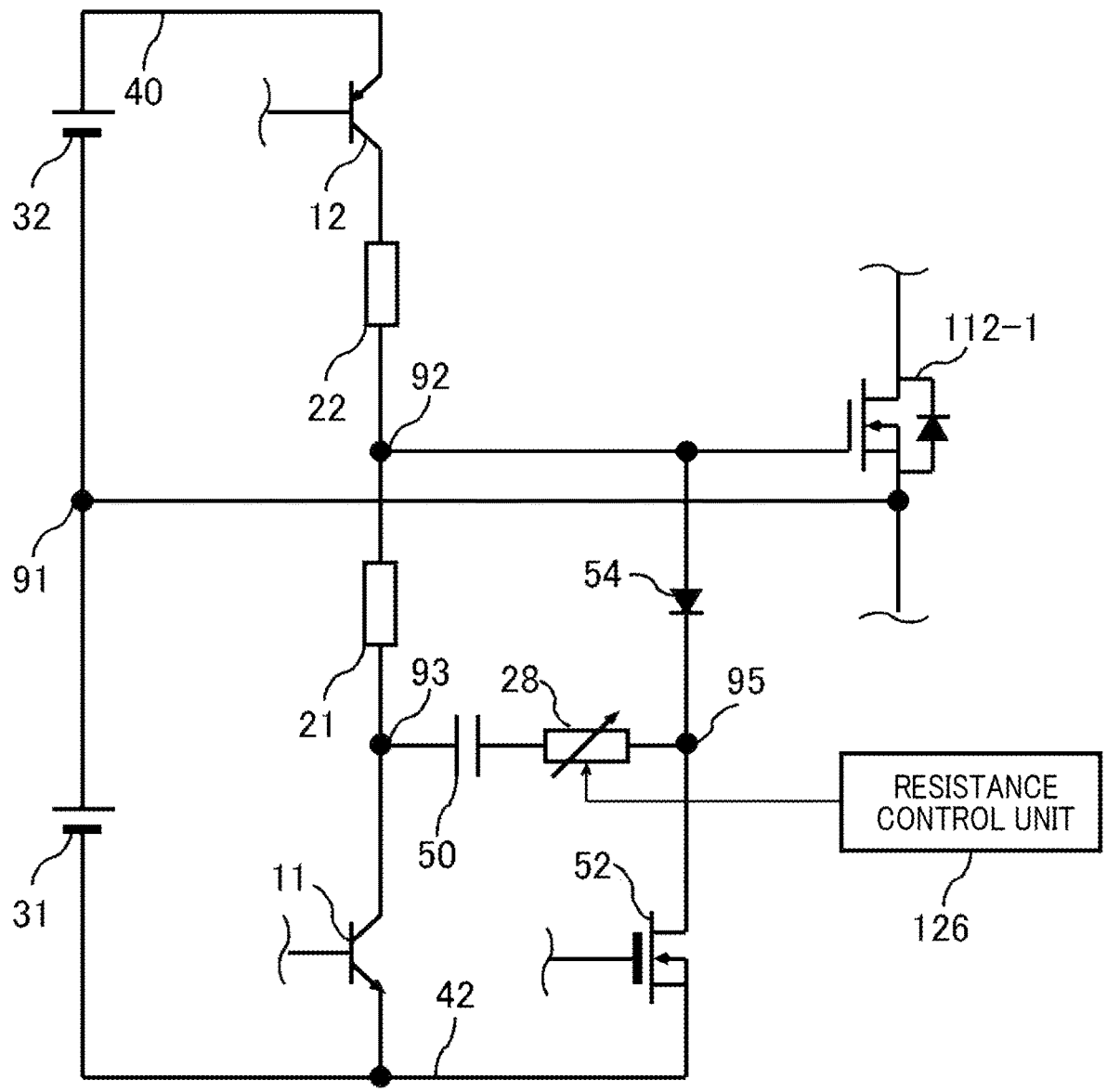
FIG. 10 is a diagram illustrating another configuration example of the driving apparatus 110.

FIG. 10 is a diagram illustrating another configuration example of the driving apparatus 110. With regard to the driving apparatus 110 of the present example, in the configuration of the driving apparatus 110 illustrated in FIG. 6, the resistance value of the fourth resistor element 28 is variable. In addition, the driving apparatus 110 may include the resistance control unit 126 configured to control the resistance value of the fourth resistor element 28. A configuration other than the fourth resistor element 28 and the resistance control unit 126 is similar to the example described with reference to FIG. 6.

According to the present example, the current flowing to the first capacitor 50 can be adjusted. In addition, when the resistance value of the fourth resistor element 28 is adjusted, the current flowing to the first capacitor 50 from the control terminal of the switching device 112 and the current flowing to the reference potential line 42 from the first capacitor 50 can be adjusted. The resistance control unit 126 may adjust the resistance value of the fourth resistor element 28 such that the conduction current of the first diode 54 is set to be within the limit value.

The resistance control unit 126 described with reference to FIG. 8 to FIG. 10 may control one or more resistances among the second resistor element 24, the third resistor element 26, and the fourth resistor element 28. In addition, the resistance control unit 126 may control the resistance value of the first resistor element 21. In this case, an inclination of the gate voltage Vgs during a period from t3 to t4 which is illustrated in FIG. 3 can be adjusted.

Figure 11:
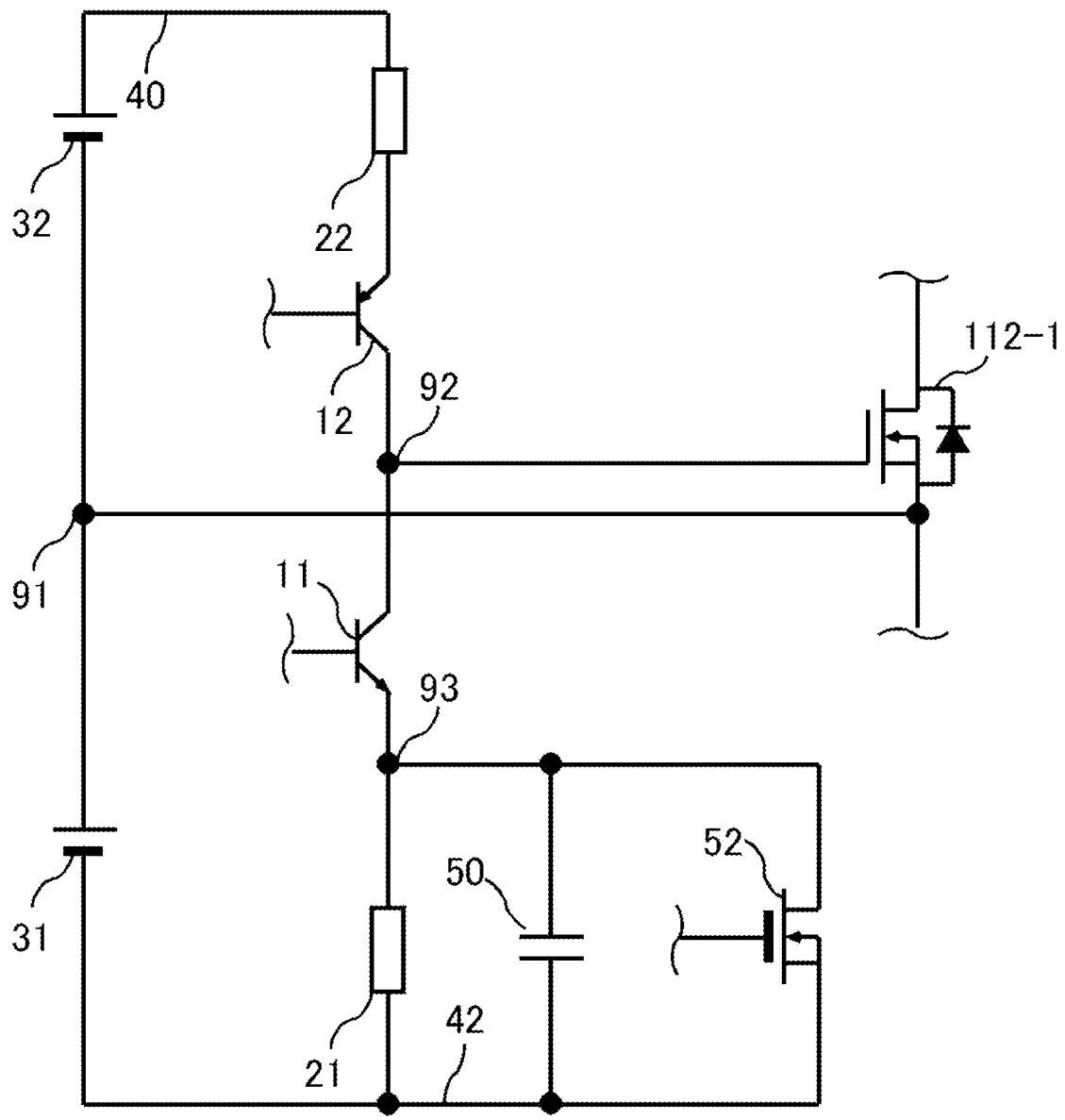
FIG. 11 is a diagram illustrating another configuration example of the driving apparatus 110.

FIG. 11 is a diagram illustrating another configuration example of the driving apparatus 110. The driving apparatus 110 of the present example further includes the discharge control unit 52 in addition to the configuration of the driving apparatus 210-1 illustrated in FIG. 1. The discharge control unit 52 of the present example also controls whether to discharge the first capacitor 50. Timing at which the discharge control unit 52 discharges the first capacitor 50 is similar to the examples described with reference to FIG. 2 to FIG. 10.

The discharge control unit 52 of the present example is provided in parallel with the first capacitor 50. The discharge control unit 52 of the present example is a transistor configured to control whether to connect both electrodes of the first capacitor 50. It is noted however that the configuration of the discharge control unit 52 is not limited to this. It is sufficient when the discharge control unit 52 can discharge the first capacitor 50 at any timing independently from the first switching control unit 11. In the present example too, the suppression of the surge voltage, the shortening of the turn-off time, and the high speed discharge of the first capacitor 50 can be realized.

Figure 12:
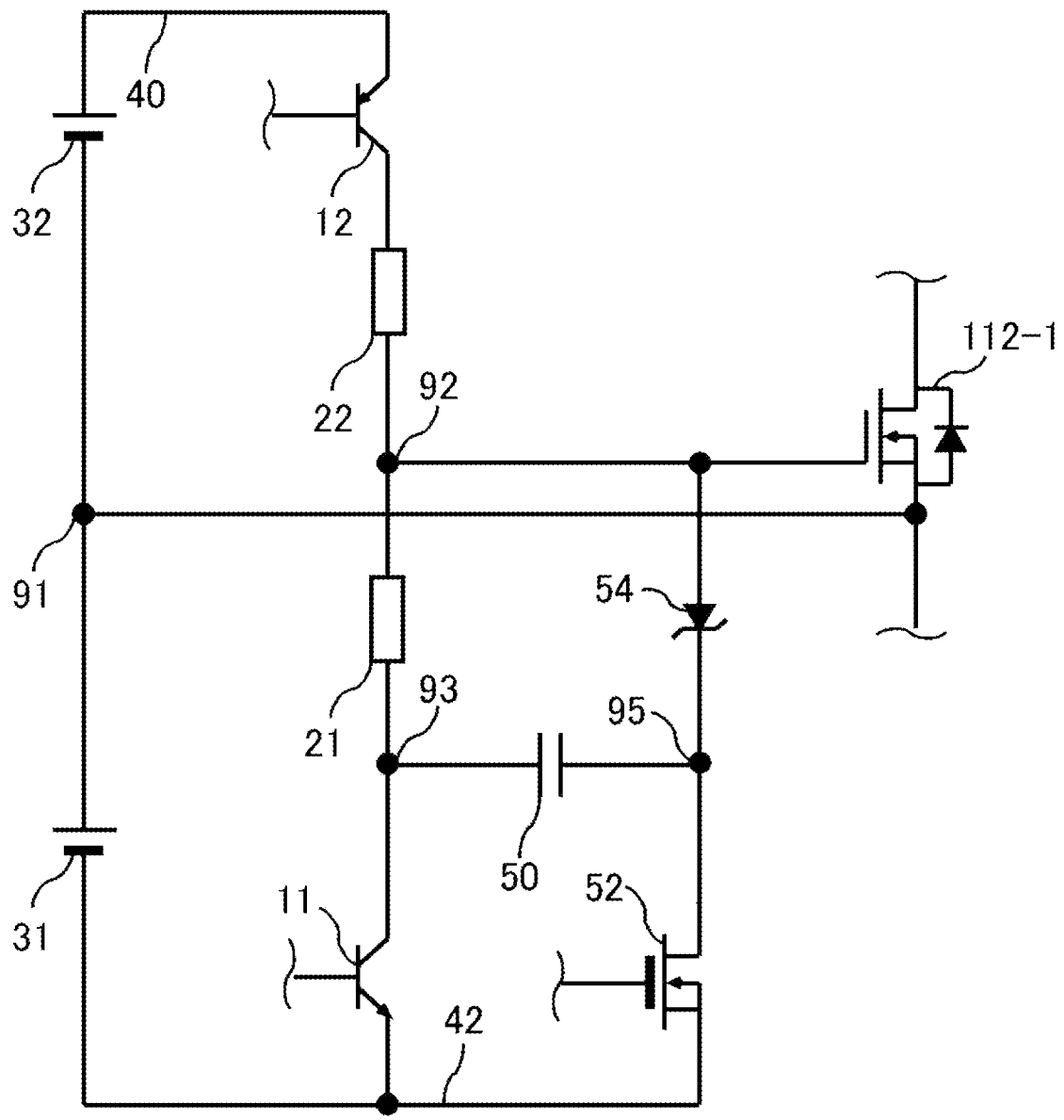
FIG. 12 is a diagram illustrating another configuration example of the driving apparatus 110.

FIG. 12 is a diagram illustrating another configuration example of the driving apparatus 110. With regard to the driving apparatus 110 of the present example, in any of the driving apparatuses 110 described with reference to FIG. 2 to FIG. 10, the first diode 54 is a Zener diode. A structure other than the first diode 54 is similar to any of the examples described with reference to FIG. 2 to FIG. 10. According to the present example, while the switching device 112 turns off, it is possible to suppress variation of the gate voltage Vgs in a negative direction.

In a state where the switching device 112-1 turns off, when the switching of the other switching device 112-2 to the on or off state is performed, the gate voltage Vgs of the switching device 112-1 may vary in a positive direction or the negative direction. When the gate voltage Vgs varies in the negative direction, dielectric breakdown may occur between the gate and the source. On the other hand, when the gate voltage Vgs varies in the positive direction, the switching device 112-1 may erroneously shift to the on state, and a short-circuit state may occur in which both the switching device 112-1 and the switching device 112-2 turn on.

As described with reference to FIG. 2 and the like, since the discharge control unit 52 functions as the active mirror clamp circuit, the erroneous shift of the switching device 112-1 to the on state can be avoided. In addition, since the Zener diode is used as the first diode 54, the variation of the gate voltage Vgs in the negative direction can be suppressed.

Figure 13:
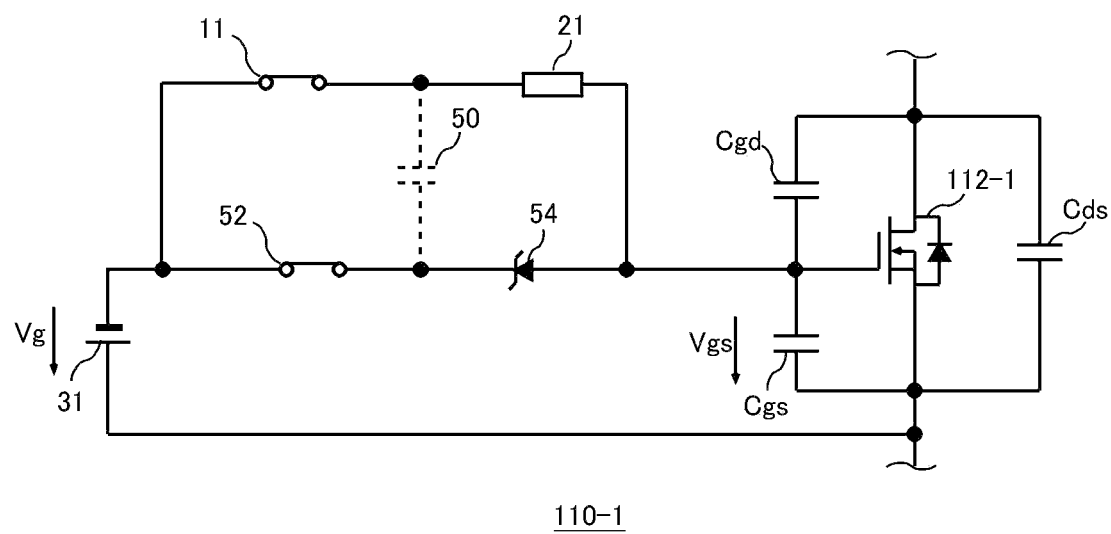
FIG. 13 illustrates an equivalent circuit of the driving apparatus 110 and the switching device 112-1 which are illustrated in FIG. 12.

FIG. 13 illustrates an equivalent circuit of the driving apparatus 110 and the switching device 112-1 which are illustrated in FIG. 12. FIG. 13 illustrates the capacitances Cgd, Cds, and Cgs between the respective terminals of the switching device 112-1. In addition, FIG. 13 illustrates an equivalent circuit in a case where the switching device 112 shifts to the off state and is put into the steady state. Both the first switching control unit 11 and the discharge control unit 52 are in the on state. In this case, the first capacitor 50 is in the short-circuit state in which electrodes at both ends are connected, and is therefore not taken into account in the equivalent circuit of FIG. 13. In the steady state, the gate voltage Vgs of the capacitance Cgs is substantially equal to the voltage Vg generated by the first power source 31.

In this state, when the switching of the other switching device 112-2 is performed, and the gate voltage Vgs rises in the negative direction, a voltage Vgs-Vg in accordance with the variation is applied to the first diode 54. Note that the similar voltage Vgs-Vg is also applied to the first resistor element 21.

When the voltage Vgs-Vg exceeds a breakdown voltage of the first diode 54, the first diode 54 turns on, and the first power source 31 and the capacitance Cgs are connected in parallel with each other. At this time, the voltage applied to the first resistor element 21 falls to 0 V. Note that the breakdown voltage of the first diode 54 is preferably designed such that the gate voltage Vgs does not exceed a gate-source withhold voltage.

Since the first power source 31 and the capacitance Cgs are connected in parallel with each other, the gate voltage Vgs is set to be equal to the voltage Vg. With this configuration, it is possible to avoid the excessive rise of the gate voltage Vgs in the negative direction.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

EXPLANATION OF REFERENCES

11: first switching control unit, 12: second switching control unit, 21: first resistor element, 22: resistor element, 24: second resistor element, 26: third resistor element, 28: fourth resistor element, 31: first power source, 32: second power source, 40: high potential line, 42: reference potential line, 50: first capacitor, 52: discharge control unit, 54: first diode, 91, 92, 93, 95, 118: connection point, 100: power supply circuit, 110, 210: driving apparatus, 112: switching device, 114: control circuit, 116: capacitor, 120: high potential line, 122: reference potential line, 124: capacitance control unit, 126: resistance control unit, 200: power supply circuit

What is claimed is:

1. A driving apparatus that drives a switching device, the driving apparatus comprising:
a reference potential line;
a first switching control unit configured to switch whether to connect a control terminal of the switching device to the reference potential line;
a first resistor element arranged in series to the first switching control unit in a path from the control terminal of the switching device to the reference potential line;
a first capacitor provided in parallel with the first resistor element in the path from the control terminal of the switching device to the reference potential line;
a discharge control unit configured to control whether to discharge the first capacitor; and
a first diode having a cathode connected to the control terminal of the switching device and an anode connected to the discharge control unit, wherein
the discharge control unit includes a first transistor arranged between the anode of the first diode and the reference potential line, and
the first capacitor is in a series current path between the anode of the first diode and the first switching control unit.

2. The driving apparatus according to claim 1, wherein:
the discharge control unit is configured to discharge the first capacitor under a condition that a control voltage at the control terminal of the switching device is lower than or equal to a first threshold voltage; and
the first threshold voltage is lower than a plateau voltage of the switching device.

3. The driving apparatus according to claim 2, wherein:
the first resistor element is arranged between the control terminal of the switching device and the first switching control unit; and
the first capacitor is arranged in parallel with the first resistor element between the control terminal of the switching device and the first switching control unit.

4. The driving apparatus according to claim 1, wherein:
the first resistor element is arranged between the control terminal of the switching device and the first switching control unit; and
the first capacitor is arranged in parallel with the first resistor element between the control terminal of the switching device and the first switching control unit.

5. The driving apparatus according to claim 1, wherein:
the switching device is any element of a pair of switching devices configured to operate in a complementary manner; and
the discharge control unit is configured to discharge the first capacitor during a period from completion of turn-off of the switching device that is set as a driving target to start of next turn-on.

6. The driving apparatus according to claim 1, further comprising:
a fourth resistor element arranged in series to the first capacitor between a connection point of the first switching control unit and the first resistor element and a connection point of the first diode and the first transistor.

7. The driving apparatus according to claim 6, wherein:
a resistance value of the fourth resistor element is variable; and
the driving apparatus further comprises a resistance control unit configured to control the resistance value of the fourth resistor element.

8. The driving apparatus according to claim 1, further comprising:
a second resistor element arranged in series to the first diode between a connection point of the first capacitor and the first transistor and the control terminal of the switching device.

9. The driving apparatus according to claim 8, further comprising:
a third resistor element arranged in series to the first transistor between the connection point of the first capacitor and the first transistor and the reference potential line.

10. The driving apparatus according to claim 8, wherein:
a resistance value of the second resistor element is variable; and
the driving apparatus further comprises a resistance control unit configured to control the resistance value of the second resistor element.

11. The driving apparatus according to claim 1, further comprising:
a third resistor element arranged in series to the first transistor between the connection point of the first capacitor and the first transistor and the reference potential line.

12. The driving apparatus according to claim 11, further comprising:
a fourth resistor element arranged in series to the first capacitor between a connection point of the first switching control unit and the first resistor element and a connection point of the first diode and the first transistor.

13. The driving apparatus according to claim 11, wherein:
a resistance value of the third resistor element is variable; and
the driving apparatus further comprises a resistance control unit configured to control the resistance value of the third resistor element.

14. The driving apparatus according to claim 1, wherein the first diode is a Zener diode.

15. The driving apparatus according to claim 1, wherein:
a capacitance of the first capacitor is variable; and the driving apparatus further comprises a capacitance control unit configured to control the capacitance of the first capacitor.

16. The driving apparatus according to claim 1, wherein the first diode is a Zener diode.

17. The driving apparatus according to claim 1, wherein the switching device is a wide bandgap semiconductor device using at least one of silicon carbide, gallium nitride, gallium oxide, and diamond as a main material.

18. The driving apparatus according to claim 1, wherein the first capacitor has a capacitance in which electric charge of the control terminal can be moved and accumulated until a control voltage at the control terminal of the switching device turns to a plateau voltage.

* * * * *